United States Patent [19]

Grabmaier

[11] 4,319,953
[45] Mar. 16, 1982

[54] METHOD FOR PRODUCING DISC OR BAND-SHAPED SI CRYSTALS WITH COLUMNAR STRUCTURE FOR SOLAR CELLS

[75] Inventor: Josef Grabmaier, Berg, Fed. Rep. of Germany

[73] Assignee: Siemens Aktiengesellschaft, Berlin & Munich, Fed. Rep. of Germany

[21] Appl. No.: 92,636

[22] Filed: Nov. 8, 1979

[30] Foreign Application Priority Data

Nov. 23, 1978 [DE] Fed. Rep. of Germany ....... 2850790

[51] Int. Cl.³ ............................................ C30B 19/06
[52] U.S. Cl. .................................... 156/608; 156/622; 156/DIG. 84
[58] Field of Search ............... 156/608, 622, DIG. 64, 156/DIG. 84, DIG. 88, DIG. 97; 148/1.5; 357/59; 427/74, 86; 428/408, 446, 620, 538

[56] References Cited

U.S. PATENT DOCUMENTS 4,171,991 10/1979 Lindmayer ................. 156/DIG. 88

FOREIGN PATENT DOCUMENTS 2622213 10/1977 Fed. Rep. of Germany ........ 164/60
2508803 3/1978 Fed. Rep. of Germany .
2837775 3/1979 Fed. Rep. of Germany ........ 427/86
1539244 1/1979 United Kingdom .

OTHER PUBLICATIONS

Electronics, Apr. 4, 1974, pp. 99–111, Rosenblatt.
NASA Tech. Briefs, Winter 1977, pp. 432–433.

*Primary Examiner*—Hiram Bernstein
*Attorney, Agent, or Firm*—Hill, Van Santen, Steadman, Chiara & Simpson

[57] ABSTRACT

Si-crystals with columnar structures are produced by casting a silicon melt through a gap provided in a crucible onto a melt-resistant carrier body having periodically spaced crystallization-seed centers on a surface thereof facing the melt, and allowing the so-cast molten silicon to cool so that crystallization of the melt onto the seed centers occurs. In a preferred embodiment, an elongated traveling band-shaped substrate having a select hole pattern therein functioning as the seed centers, is utilized as the carrier body.

9 Claims, 1 Drawing Figure

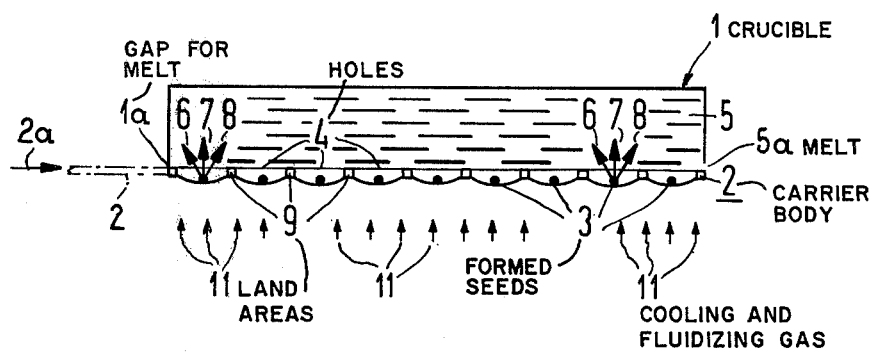

METHOD FOR PRODUCING DISC OR BAND-SHAPED SI CRYSTALS WITH COLUMNAR STRUCTURE FOR SOLAR CELLS

BACKGROUND OF THE INVENTION

1. Field of the Invention

The invention relates to silicon crystals useful in solar cells and somewhat more particularly to a method for producing disc or band-shaped silicon crystals with columnar structures.

2. Prior Art

When solar cells are produced from silicon, the most economically available silicon material should be utilized since the requirements for such component elements relative to crystal quality are not as high as those required in producing semiconductor component elements useful in integrated circuits.

Accordingly, it is desirable to find a means of producing silicon crystals which is simple and economical and does not involve excessive loss of materials. Further, such material-wasting and time-consuming steps as, for example, sawing a silicon bar produced by traditional crystal-growth methods, into crystal discs as well as lapping and polishing of such disc surfaces should be eliminated.

German Offenlegungsschrift (hereinafter DT-OS) No. 25 08 803 suggests that plate-shaped silicon crystals having a columnar structure are very useful as base materials for producing solar cells whereby an efficiency of more than 10% can be achieved. The process of producing such silicon crystals set forth in this DT-OS generally comprises providing a melt composed of a pre-purified polycrystalline silicon, feeding or casting such melt into a cooled graphite mold of suitable shape and allowing the so-cast melt to solidify in the mold over a temperature gradient. After solidification, the bar shaped silicon crystals have a columnar structure formed in a direction of the shortest axes of the monocrystalline crystal areas with crystallographic preferred orientation and exhibit semiconductive properties. In the manufacture of solar cells, crystal discs of about $100 \times 100$ mm$^2$ and a thickness of about 500 $\mu$m are sawed from the bars produced in the above-described manner with diamond saws conventional in semiconductor technology. Solar cells produced in accordance with known techniques from such discs have an efficiency which fluctuates between about 8.2% at a cell edge, up to 10.5% at the center of the cell. The efficiency thus achieved very nearly matches that of solar cells produced from monocrystalline silicon, which exhibit an efficiency of about 12% to 14%. However, the process described by the above-referenced DT-OS requires a sawing process to divide the bars into discs and such sawing cannot be omitted. Further, the size of the bars is determined by the size of the casting mold required for their manufacture.

Another process for producing economical silicon is suggested in *Electronics*, page 108, Apr. 4, 1974. With this process, a polycrystalline silicon band having a length of at least 1 meter is produced by casting a silicon melt onto a cooled, traveling carrier body composed of molybdenum or onto a traveling band coated with a silicon nitride layer so that the polycrystalline band is produced in a manner somewhat similar to assembly-line principles. However, the resultant silicon material does not have columnar structure so that solar cells produced therefrom exhibit an efficiency of less than about 5%.

SUMMARY OF THE INVENTION

The invention provides a method for producing silicon crystal discs and bands having columnar structures, which are useful in producing solar cells with increased efficiency. In accordance with the principles of the invention, such discs and bands are produced without requiring a sawing process, which causes material and time losses. Further, a solidification limited to casting molds, which requires additional work steps and devices and also determines the size of the silicon bar manufactured in that manner, is avoided.

In accordance with the principles of the invention, a silicon melt in a crucible is cast through a gap provided therein onto a carrier body having a surface thereof provided with periodically spaced-apart crystallization seed centers for growth of desired columnar structure, so that the carrier body surface having the seed centers thereof contacts the so-cast melt and the cast silicon melt is cooled so that crystallization occurs and a layer of silicon crystal discs and/or bands having a columnar structure forms on the carrier body.

In a preferred embodiment of the invention, the carrier body comprises a band composed of a silicon melt-resistant material, such as quartz glass, graphite or zirconium oxide and a surface thereof is provided with a selected hole pattern, such as comprised of hexagonally-arranged holes, each having an axial width ranging from about 100 to 300 $\mu$m, with spacing between one hole center to another hole center in a range of about 150 to 350 $\mu$m. Dopants may be provided within the carrier body holes for incorporation in the produced silicon bodies and the carrier body may be cooled, as by an inert gas stream directed onto the carrier body from below.

In another preferred embodiment of the invention, the melt-containing crucible and the carrier body are moved relative to one another. In an exemplary embodiment, the carrier body may comprise an elongated traveling web or band which is moved by guide rollers, as in a conveyor belt device. This embodiment is a very economical flow-through process, which in an exemplary embodiment occurs at a web velocity of about 1 meter per minute and provides silicon discs and/or bands having a thickness of about 100 $\mu$m.

BRIEF DESCRIPTION OF THE DRAWINGS

The FIGURE is an elevated, somewhat schematic, cross-sectional view of an apparatus useful to practice of the invention.

DESCRIPTION OF THE PREFERRED EMBODIMENTS

The present invention provides a method for producing disc or band-shaped silicon crystals with columnar structures which are useful in the manufacture of solar cells by casting molten silicon onto a carrier body composed of a material resistant to the melt and allowing the melt to solidify on seed centers within the carrier body at a temperature gradient established at the contacting surfaces of such carrier body and silicon melt.

Referring now to the drawing, an operative melting crucible 1 is provided with a silicon melt 5. The carrier body 2 is composed of a silicon melt-resistant material, such as quartz glass, graphite or zirconium oxide and is provided with a plurality of periodic spaced-apart crystallization seed centers on the surface. The carrier body 2 is positioned, as shown, beneath a gap 1a of crucible 1 so as to receive the molten silicon from the crucible. The carrier body 2 may be an elongated band moving in direction 2a, as by-passing over a plurality of guide rolls (not shown) in a manner similar to a conveyor belt device. The carrier body 2 is provided with a plurality of openings or holes 4 with bars or land areas 9 between adjacent holes. Because of the very high surface tension of molten silicon, the molten liquid silicon is retained by the carrier body and the land areas between the individual holes can be very thin so that such carrier body assumes the form of a net in a first approximation. This type of carrier body is advantageous since, given a uniform size of mesh openings, the individual crystal columns of the silicon layer grow or crystallize with a very uniform cross-section since the axial width of the mesh openings in the carrier body determines the columnar cross-section.

The monocrystalline columnar-like growth or crystallization of the crystal layer is further encouraged by cooling from beneath, such as via a inert gas stream 11. In certain embodiments, a sufficiently strong gas stream can be utilized for cooling so that the silicon layer crystallizes out on a gas cushion. In such an embodiment, the crystallization seed centers are, of necessity, defined in terms of positioned and density by means of the shape and density of the holes in the carrier body.

As a result of the temperature gradient perpendicular to the carrier body 2 (caused by radiation of heat within the molten silicon, but which does not occur through the bar or land areas 9 between the holes 4), crystallization seeds 3 are formed. Such seed preferably form at the lowest point of the silicon melt 5, which is convexly shaped between adjacent bars 9 (or within each opening or hole area) of the carrier body 2. Generally, such seeds have different growth directions (schematically illustrated by arrows 6, 7 and 8). However, because of the specific form of the carrier body 2, only such seeds which grow perpendicular to the surface of the carrier body (schematically illustrated by arrow 7) have a high chance of growth.

Because silicon has a relatively high melting point (1430° C.) and quartz glass is, at best, only slightly moistened by molten silicon, in accordance with the preferred embodiment of the invention, the carrier body may be composed of quartz glass wool compressed to form an elongated mat or foil. For achieving a desired columnar structure with crystal columns of uniform cross-section, select geometrically-shaped holes may be provided in such carrier body at periodic spaced-apart intervals. Hexagonally-arranged holes are particularly preferably. In a preferred embodiment for forming particularly useful columnar structures, holes are utilized which have an axial width in the range of about 100 to 300 μm and are spaced apart so that the interval from hole center to hole center is in the range of about 150 to 350 μm.

In other embodiments of the invention, quartz glass wool may be replaced by graphite or zirconium oxide fibers and these materials can also be processed into mats or elongated webs.

In order to achieve a uniform layer thickness of the grown silicon, is preferable to guide the carrier body having the molten silicon film thereon through an aperture 5a of a specific size, such as defined by a trailing edge of the crucible 1 whereby any excess melt is stripped-off.

It is advantageous in further processing of the produced silicon, as well as in the use of the silicon discs or band-shaped silicon layers during the production of solar cells (having a thickness of approximately 100 to 500 μm) to allow the grown silicon layer to remain in contact with the carrier body, whether it be a finite dimensioned mat or an elongated net-like body. By proceeding thusly, the silicon layer or solar cells produced therefrom become self-supporting with all of the accompanying advantages. For example, by proceeding in this manner, substantially less silicon material is required. Moreover, for certain special purposes, the carrier body can be provided with a conductive layer, such as a doped layer containing tin oxide or zinc oxide or mixtures of such dopant compounds. Additionally, the carrier layer itself may be composed of a conductive material, such as, for example, molybdenum.

Silicon layers manufactured in accordance with the principles of the invention are extremely smooth and have a very high surface planarity. Such silicon layers can be produced directly with a desired layer thickness of a few 100 μm and traditional sawing, lapping or polishing processes, typically necessary for producing silicon crystal discs for solar cells are superfluous and can be omitted. In accordance with desired solar cell dimensions, the basic elements for the solar cell (silicon discs) are simply separated from the finished silicon layer or band, which if desired, may be wound-up.

Further, the principles of the invention allow one to economically manufacture silicon substrates for relatively large-surfaced, amorphous solar cells.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. A method of producing disc or band-shaped silicon crystals having a columnar structure and useful in the manufacture of solar cells, comprising:
    casting molten silicon through a gap located at the bottom of a crucible containing said molten silicon onto a band-shaped carrier body composed of a material which is resistant to said molten silicon, said carrier body having substantially uniform mesh openings which substantially define the crystalline columnar structures in said disc or band-shaped silicon crystals; and
    cooling said carrier body by directing a stream of inert gas against the underside of said carrier body whereby silicon grows with a columnar structure in said mesh openings.

2. A method as defined in claim 1, wherein said crucible and said carrier body are moved relative to one another.

3. A method as defined in claim 2, wherein the rate of movement between said crucible and said carrier body is about one meter per minute whereby a silicon layer having a thickness of about 100 μm is crystallized onto said carrier body.

4. A method as defined in claim 1, wherein said holes within the carrier body each have an axial width in the range of about 100 to 300 μm.

5. A method as defined in claim 1, wherein said holes within the carrier body are spaced from one another so that the distance from one hole center to an adjacent hole center is in the range of about 150 to 350 μm.

6. A method as defined in claim 1, wherein said holes within said carrier body are hexagonally arranged.

7. A method as defined in claim 1, wherein said carrier body is composed of a material selected from the group consisting of quartz glass, graphite and zirconium oxide and comprises a compressed mat or foil of such material.

8. A method as defined in claim 1, wherein said carrier body comprises a net-like body having substantially uniform mesh openings therein, said openings being of a size adapted to the columnar structure of silicon crystal.

9. A method as defined in claim 1, wherein said carrier body with a layer of molten silicon thereon is guided through a select size aparture so as to achieve a uniform silicon layer thickness and strip-off any excess silicon melt.

* * * * *